(12) United States Patent
Gao

(10) Patent No.: US 11,800,681 B2
(45) Date of Patent: Oct. 24, 2023

(54) RACK BASED DISTRIBUTION UNIT FOR ELECTRONICS COOLING

(71) Applicant: Baidu USA LLC, Sunnyvale, CA (US)

(72) Inventor: Tianyi Gao, Sunnyvale, CA (US)

(73) Assignee: BAIDU USA LLC, Sunnyvale, CA (US)

(*) Notice: Subject to any disclaimer, the term of this patent is extended or adjusted under 35 U.S.C. 154(b) by 114 days.

(21) Appl. No.: 17/469,654

(22) Filed: Sep. 8, 2021

(65) Prior Publication Data

US 2023/0075798 A1    Mar. 9, 2023

(51) Int. Cl.
*H05K 7/20* (2006.01)

(52) U.S. Cl.
CPC ..... *H05K 7/20272* (2013.01); *H05K 7/20818* (2013.01)

(58) Field of Classification Search
CPC ... H05K 7/1488–1489; H05K 7/20154; H05K 7/2029; H05K 7/20236; H05K 7/20354; H05K 7/20272; H05K 7/20309–20327; H05K 7/20509; H05K 7/20627–20645; H05K 7/20663; H05K 7/20681; H05K 7/207; H05K 7/20718; H05K 7/20736; H05K 7/20754; H05K 7/20763–20781; H05K 7/20818; H05K 7/20827; H05K 7/20836; H05K 7/20881; H05K 7/209; H05K 7/20936; H05K 1/0203–0204; H01L 23/427; H01L 23/473; H01L 23/31; H01L 23/34; H01L 23/36; H01L 23/3677; H01L 23/3733; H01L 23/3737; H01L 23/4006; H01L 2023/405; H01L 2023/4062; H01L 2023/4087; F28D 15/02; F28D 15/0266; F28D 15/0275
See application file for complete search history.

(56) References Cited

U.S. PATENT DOCUMENTS

| | | | |
|---|---|---|---|
| 10,785,892 B1* | 9/2020 | Chen | H05K 7/20281 |
| 2006/0065874 A1* | 3/2006 | Campbell | H05K 7/20772 251/348 |
| 2017/0181324 A1* | 6/2017 | Shelnutt | H05K 7/20781 |
| 2019/0166724 A1* | 5/2019 | Moss | H05K 7/207 |
| 2020/0015387 A1* | 1/2020 | Farshchian | H05K 7/20818 |
| 2021/0385978 A1* | 12/2021 | Shao | H05K 7/1489 |
| 2022/0346285 A1* | 10/2022 | Heydari | H05K 7/20327 |
| 2023/0092620 A1* | 3/2023 | Gao | H05K 7/1408 |

* cited by examiner

*Primary Examiner* — Amir A Jalali
(74) *Attorney, Agent, or Firm* — WOMBLE BOND DICKINSON (US) LLP

(57) ABSTRACT

A distribution chassis comprises a supporting frame, one or more main connector, and a node distribution unit having one or more node connectors, where the distribution chassis corresponds to a server chassis and connected to a rack distribution unit, where the server chassis includes one or more server nodes, each server node represents a package associated with one or more electronics, where the distribution chassis is disposed above the server chassis to distribute cooling liquid to the one or more server nodes of the server chassis, where the node distribution unit is disposed to be movable along the supporting frame from a first position to a second position, and where the one or more node connectors of the node distribution unit are connected with one or more fluid connecters of a corresponding node when the node distribution unit is in the second position.

20 Claims, 11 Drawing Sheets

RACK BASED DISTRIBUTION UNIT FOR ELECTRONICS COOLING

FIELD OF THE INVENTION

Embodiments of the present disclosure relate generally to data center and server cooling. More particularly, embodiments of the disclosure relate to liquid cooling for electronics.

BACKGROUND

Cooling is a prominent factor in a computer system and data center design. The number of high performance electronics components such as high performance processors packaged inside servers has steadily increased, thereby increasing the amount of heat generated and dissipated during the ordinary operations of the servers. The reliability of servers used within a data center decreases if the environment in which they operate is permitted to increase in temperature over time. Maintaining a proper thermal environment is critical for normal operations of these servers in data centers, as well as the server performance and lifetime. It requires more effective and efficient cooling solutions especially in the cases of cooling these high performance servers.

With the power density of a single processor or artificial intelligence (AI) acceleration device increasing significantly, the server packaging becomes more and more compact. Thus, multiple server nodes may be populated in parallel on an electronic rack. Currently, server nodes with information technology (IT) electronics are mainly based on air cooling approach. However, the air cooling approach does not support high power density systems. It is difficult to deploy efficient liquid cooling for server nodes in hyper scale data centers.

BRIEF DESCRIPTION OF THE DRAWINGS

Embodiments of the disclosure are illustrated by way of example and not limitation in the figures of the accompanying drawings in which like references indicate similar elements.

DETAILED DESCRIPTION

Figure 1A:
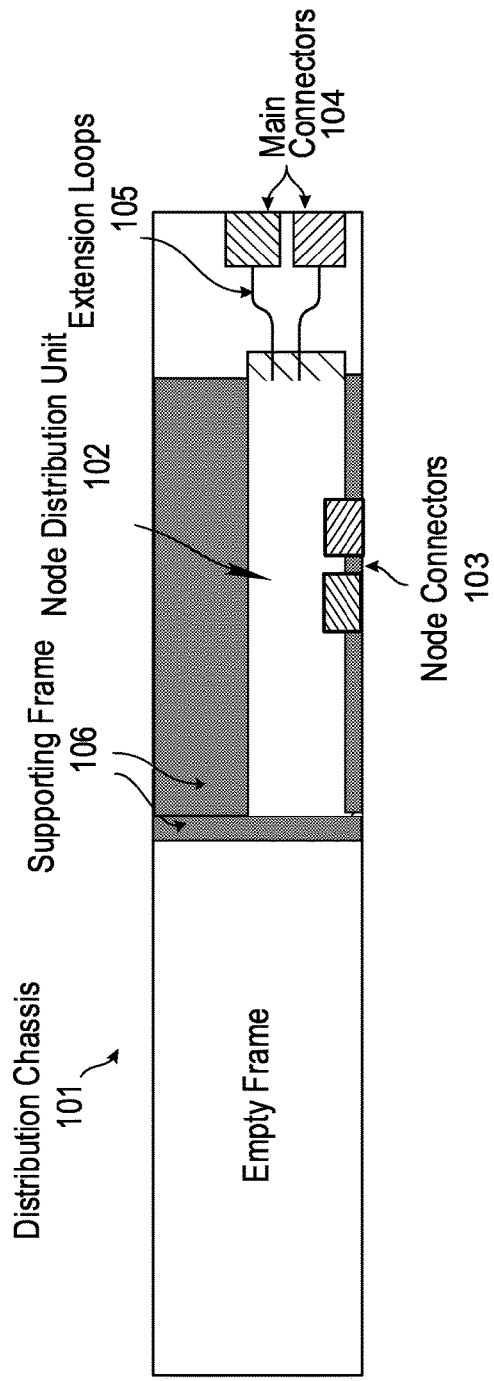
FIG. 1A is a diagram illustrating an example of a side view of a distribution chassis according to some embodiments.

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

According to some embodiments, liquid cooling solutions for server nodes is provided herein. In this solution, an electronic rack of a data center may include distribution chassis and corresponding server chassis to enable liquid cooled server nodes with IT equipment (electronics), where the fluid connectors connecting the distribution chassis and the corresponding server chassis are protected. The present solutions include a plurality of distribution chassis which are populated to the electronic rack of the data center.

Each distribution chassis is connected to a rack distribution unit and to distribute a cooling fluid to an individual node associated with a server node. The distribution chassis may include one or more distribution units. Each distribution unit is attached with fluid connectors including both the main connectors and the node connectors. Each distribution unit is assembled onto supporting frames which are integrated on the distribution chassis. Each distribution unit is connected to the main connectors through flexible hoses.

The one or more distribution units are used for serving several blades integrated under the distribution chassis. The one or more distribution unit can be pushed down to the node along the designed channel on the supporting frames, and the node connectors are connected to the fluid connectors of the node. In one embodiment, the distribution units are designed in separate modules connected with extension loops. The liquid cooling solutions disclosed herein provide a highly efficient hardware system and a rack architecture for deploying liquid cooling for server nodes in hyper scale data centers. By this way, efficient fluid distribution and management are enabled, and different rack architectures and different server nodes are accommodated. The electronic rack is further highly reliable and offers ease of operation and ease of service.

According to some embodiments, an electronic rack of a data center is disclosed herein. The electronic rack comprises a rack distribution unit, a plurality of server chassis and a plurality of distribution chassis. Each of the plurality of server chassis includes one or more server nodes, each server node represents a package associated with one or more electronics. The plurality of distribution chassis corresponds to the plurality of server chassis and is connected to the rack distribution unit. Each of the distribution chassis is disposed above a corresponding server chassis to distribute cooling liquid to the one or more server nodes of the server chassis, where each of the plurality of distribution chassis includes a supporting frame, a node distribution unit having one or more node connectors, and one or more main connectors. The node distribution unit is disposed to be movable along the supporting frame from a first position to a second position, and the one or more node connectors of the node distribution unit are connected with one or more fluid connecters of a corresponding node when the node distribution unit is in the second position.

According to some embodiments, a data center system is disclosed herein. The data center system comprises an array of electronic racks, each electronic rack containing a plurality of server chassis and each server chassis corresponding to one or more servers, where each electronic rack comprises a rack distribution unit, a plurality of server chassis and a plurality of distribution chassis. Each of the plurality of server chassis includes one or more server nodes, each server node represents a package associated with one or more electronics. The plurality of distribution chassis corresponds to the plurality of server chassis and is connected to the rack distribution unit.

Each of the distribution chassis is disposed above a corresponding server chassis to distribute cooling liquid to the one or more server nodes of the server chassis, where each of the plurality of distribution chassis includes a supporting frame, a node distribution unit having one or more node connectors, and one or more main connectors, where the node distribution unit is disposed to be movable along the supporting frame from a first position to a second position, and where the one or more node connectors of the node distribution unit are connected with one or more fluid connecters of a corresponding node when the node distribution unit is in the second position.

According to some embodiments, a distribution chassis is disclosed herein. The distribution chassis comprises a supporting frame, one or more main connector, and a node distribution unit having one or more node connectors, where the distribution chassis corresponds to a server chassis and connected to a rack distribution unit, where the server chassis includes one or more server nodes, each server node represents a package associated with one or more electronics, where the distribution chassis is disposed above the server chassis to distribute cooling liquid to the one or more server nodes of the server chassis, where the node distribution unit is disposed to be movable along the supporting frame from a first position to a second position, and where the one or more node connectors of the node distribution unit are connected with one or more fluid connecters of a corresponding node when the node distribution unit is in the second position.

In one embodiment, for each of the plurality of distribution chassis, the distribution unit is connected with the one or more main connectors through extension loops. In one embodiment, for each of the plurality of distribution chassis, the one or more node connectors include one or more blind mating node connectors configured to be connected with the one or more fluid connecters of a corresponding server node. In one embodiment, each of the plurality of distribution chassis includes one or more distributed modules, wherein the one or more distributed modules are connected through flexible hoses.

In one embodiment, for each of the plurality of distribution chassis, the distribution unit is connected to the rack distribution unit by the one or more main connectors. In one embodiment, for each of the plurality of server chassis, the node includes one or more fluid connecters disposed at a top of a corresponding server chassis. In one embodiment, for each of the plurality of server chassis, the node includes a connector assembler which one or more fluid connecters are fixed onto. In one embodiment, for each of the plurality of server chassis, the note includes a leak detection cable connected to a connector assembler and a leak detection cable disposed at a bottom of a corresponding server chassis.

Figure 1B:
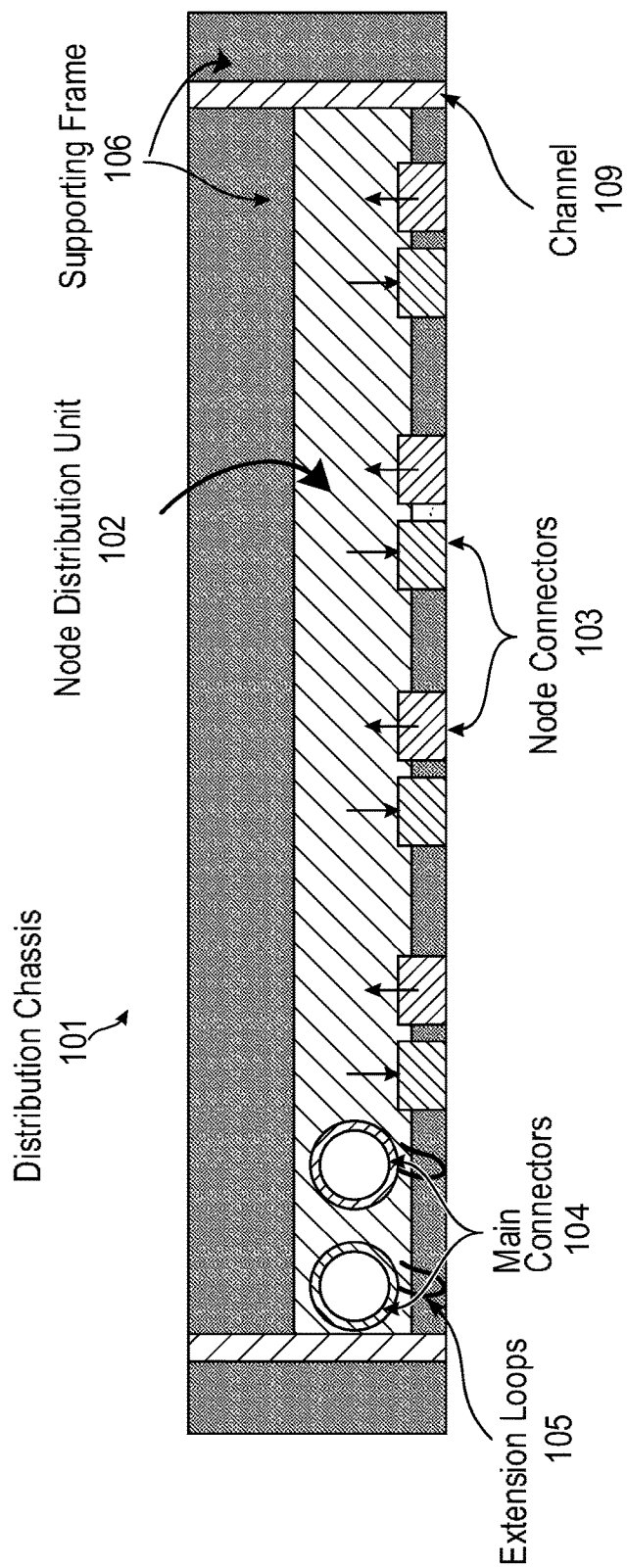
FIG. 1B is a diagram illustrating an example of a front view of a distribution chassis according to some embodiments.

FIG. 1A is a diagram 100*a* illustrating an example of a side view of a distribution chassis 101 according to some embodiments. FIG. 1B is a diagram 100*b* illustrating an example of a front view of the distribution chassis 101 according to some embodiments. An electronic rack of a data center may comprise a rack distribution unit, a plurality of server chassis and a plurality of distribution chassis. Each of the plurality of server chassis may include one or more server nodes, and each server node may represent a package associated with one or more electronics. The term "node" and "blade node" are used interchangeably in this disclosure. The plurality of distribution chassis corresponds to the plurality of server chassis and is connected to the rack distribution unit. Each of the distribution chassis is disposed above a corresponding server chassis to distribute cooling liquid to the one or more server nodes of the server chassis. Each node distribution unit is disposed to be movable to be connected with or disconnected from one or more fluid connecters of a corresponding node.

Referring to FIG. 1A and FIG. 1B, the distribution chassis 101 may include one or more distribution unit, e.g., distribution unit 102. the distribution chassis 101 may include one or more supporting frames 106, a node distribution unit 102 having one or more node connectors 103, and one or more main connectors 104. The main connectors 104 and the node connectors 103 are attached on the distribution unit 102. The distribution unit 102 is assembled onto supporting frames 106 which are integrated on the distribution chassis 101. The distribution unit 102 is connected to the main connectors 104 through flexible hoses or extension loops 105. The node distribution unit 102 is used for a server node (not shown) integrated under the distribution chassis 101. The node connectors 103 may be connected to the fluid connectors of the node.

As illustrated in FIG. 1A, the distribution chassis 101 may be packaged with the node distribution unit 102 which is attached onto the supporting frames 106. The distribution chassis 101 may be design with a portion of the chassis empty. The node distribution unit 102 may be moved down vertically along the frame 106. The node distribution unit 102 may be pushed down to an electronic package node (not shown) associated with the server node along a designed channel (e.g., channel 109 in FIG. 1B, or channel 209 in FIG. 1C) on the supporting frames 106. The supporting frames 106 may include a dedicated mechanical structure for assembling the node distribution unit 102 as well as enabling the node distribution unit 102 moving during operation. Thus, the node distribution unit 102 is movable along the supporting frames 106 from a first position which is a disconnected position to a second position which is a connected position. The node connectors 103 are connected with one or more fluid connecters of a corresponding node when the node distribution unit 102 is in the second position. The node connectors 103 are disconnected with one or more fluid connecters of a corresponding node when the node distribution unit 102 is in the first position. The node distribution unit 102 may be pushed down to be connected with the node (not shown) and pulled up to be disconnected form the node quickly with easy operation.

The main connectors 104 are to be connected to the rack distribution unit (not shown) of the electronic rack. The main connectors 104 are connected with the node distribution unit 102 through extension loops 105. The node connectors 103 may be fixed onto the node distribution unit 102.

The node distribution unit 102 may include running cooling liquid or fluid as well as the dedicated loops 105 for connecting the main connectors 104 with the one or more node connectors 103. Before the node distribution unit 102 being pushed down, the node connectors 103 are within the distribution chassis 101 and protected from the supporting frames 106 of the distribution chassis 101. After the node distribution unit 102 being pushed down, the node connectors 103 are extended outside the distribution chassis 101 and being connected with the connectors of the corresponding node.

As illustrated in FIG. 1B, the distribution chassis 101 may include more than one node connectors 103. The main connectors 104 are connected to the node distribution unit 102 via extension loops 105. The main connectors 104 may be fixed onto the distribution chassis 101 before connecting to the rack distribution unit. The support frames 106 may include two dedicated channels and the node distribution unit 102 may be moved along the frames 106 within the designed ranges in the two dedicated channels and being movably fixed on the supporting frames 106. The node connectors 103 may include blind mating node connectors configured to be connected with fluid connecters of a corresponding server node.

The liquid cooling solutions disclosed herein provide a highly efficient hardware system and a rack architecture for deploying liquid cooling for server nodes in hyper scale management are enabled, and different rack architectures and different server nodes are accommodated. The electronic rack is further highly reliable and offers ease of operation and ease of service.

Figure 2:
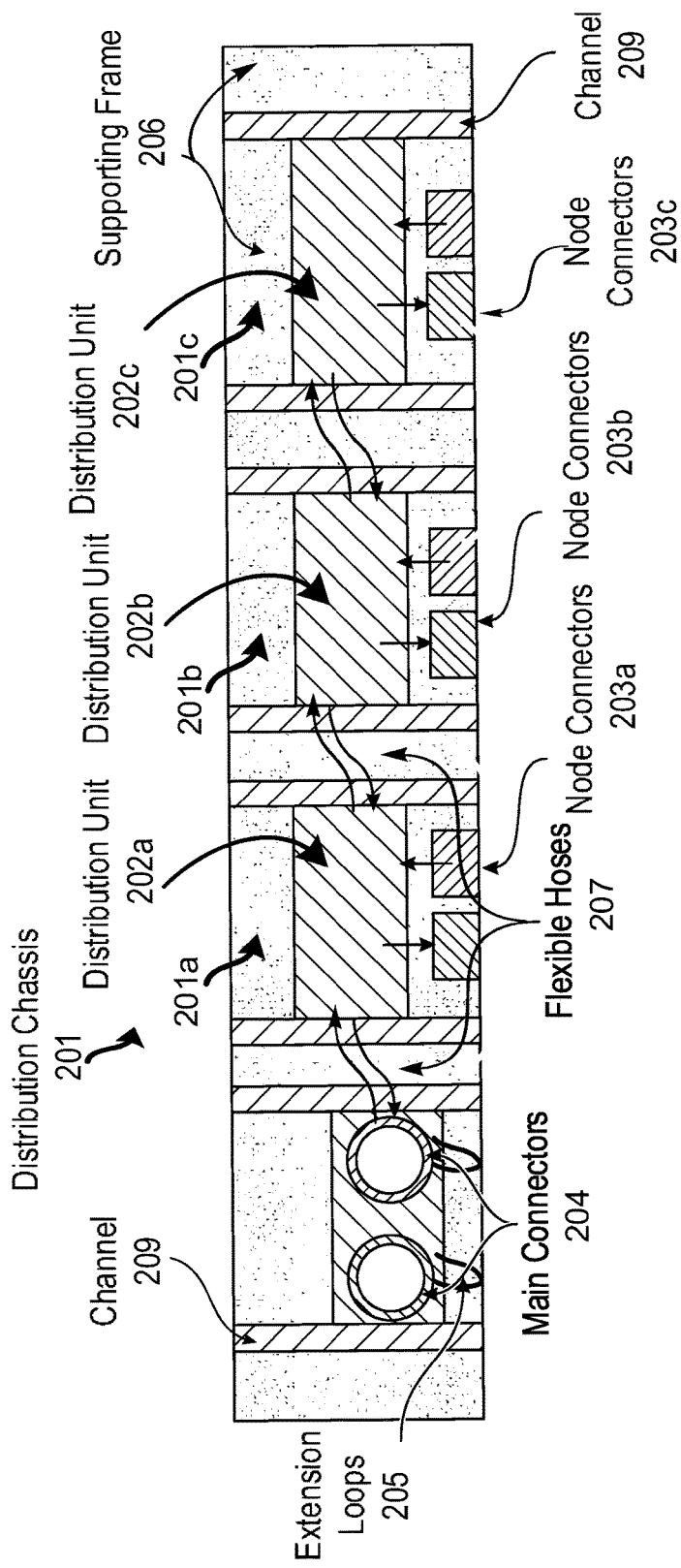
FIG. 2 is a diagram illustrating an example of a distribution chassis with distributed modules according to some embodiments.

FIG. 2 is a diagram 200 illustrating an example of a distribution chassis 201 with distributed modules 201a, 201b, 201c according to some embodiments. The distribution chassis 201 may be designed within individual distributed modules, e.g., 201a, 201b, 201c. The distributed modules 201a, 201b, 201c may be connected through flexible hoses 207 as well as equipped and attached onto dedicated supporting frames 206. Each distributed module, e.g., 201a, 201b, 201c may include a respective node distribution unit 202a, 202b, or 202c having one or more respective node connectors 203a, 203b, or 203c. Each distributed module, e.g., 201a, 201b, 201c may distribute the cooling liquid or fluid to a corresponding individual IT node (not shown) disposed under the distributed module. By this way, each individual IT node that the distribution chassis 201 serving for may have a more flexible operation or service.

Figure 3:
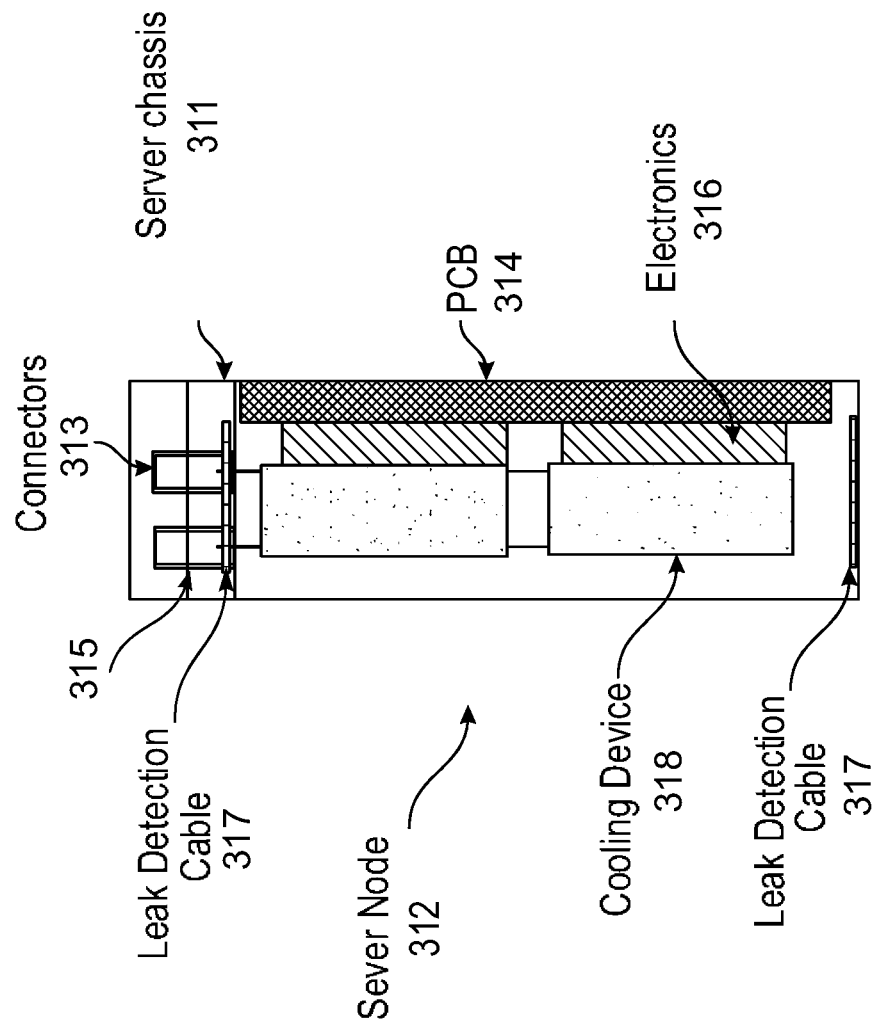
FIG. 3 is a diagram illustrating an example of a server node representing a node according to some embodiments.

FIG. 3 is a diagram 300 illustrating an example of a server chassis 311 including a server node 312 according to some embodiments. An electronic rack of a data center may comprise a rack distribution unit, a plurality of server chassis and a plurality of distribution chassis. Each of the plurality of server chassis may include one or more server nodes, and each server node may represent a package associated with one or more electronics. The plurality of distribution chassis corresponds to the plurality of server chassis and is connected to the rack distribution unit. Each of the distribution chassis is disposed above a corresponding server chassis to distribute cooling liquid to the one or more server nodes of the server chassis.

Each node distribution unit is disposed to be movable to be connected with or disconnected from one or more fluid connecters of a corresponding node. Each node may include one or more electronics cards (e.g., printed circuit boards (PCBs)). It is important to increase card level service granularity such that when an individual card fails, the individual card can be removed from a server chassis and be serviced without removing the entire server chassis. It is advantageous that the individual card can be disconnected from the server chassis and connected to the server chassis quickly with ease operation.

Referring to FIG. 3, the node 312 may include one or more electronics 316 on a PCB 314 (e.g., electronics card) and corresponding cooling devices 318 (e.g., cold plates). The node 312 may include fluid connectors 313 located on the top of the server chassis 311. The server chassis 311 may include a connector assembler 315 where the connectors 313 are fixed onto. The fluid connectors 313 are to be connected to the node connectors (e.g., 103) of a corresponding node distribution unit (e.g., 102) when the node distribution unit is pushed down and disconnected from the node connectors (e.g., 103) of the corresponding node distribution unit (e.g., 102) when the node distribution unit is pulled up.

In the server chassis 311, leak detection cables 317 may be added to the connector assembler 315 as well as the bottom of the server chassis 311, as illustrated in FIG. 3.

Figure 4A:
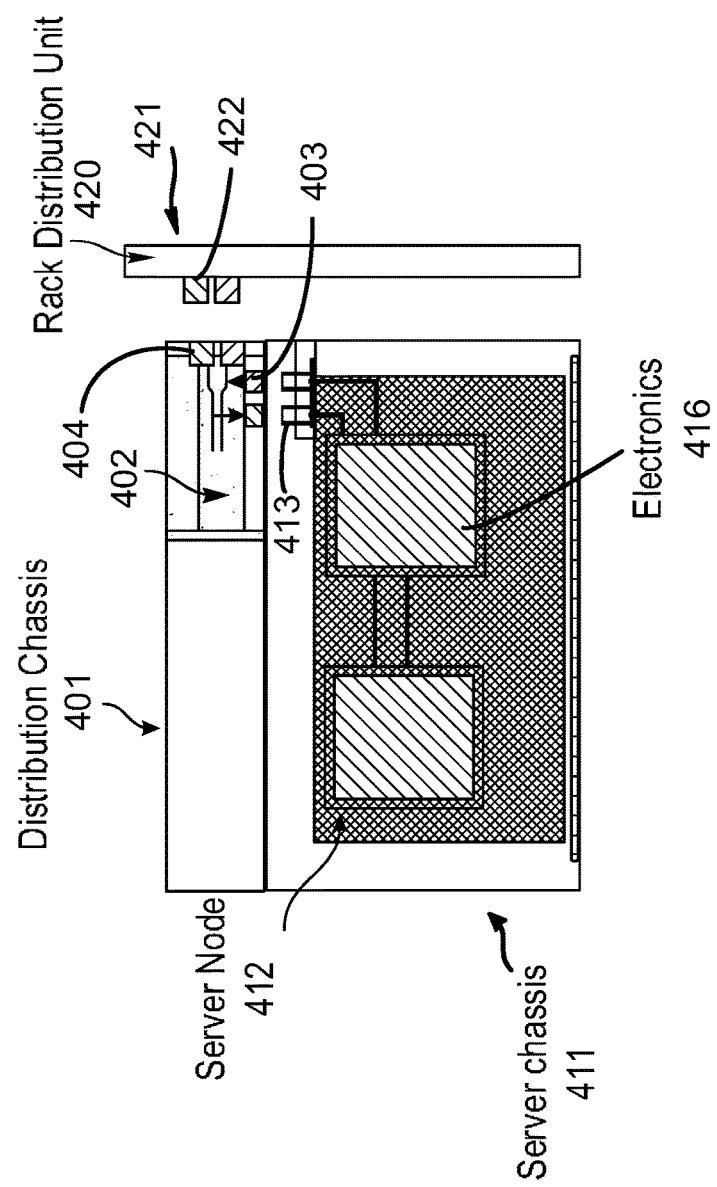
FIGS. 4A-4C are diagrams illustrating an example of operations to connect a distribution chassis to a node according to some embodiments.
Figure 4B:
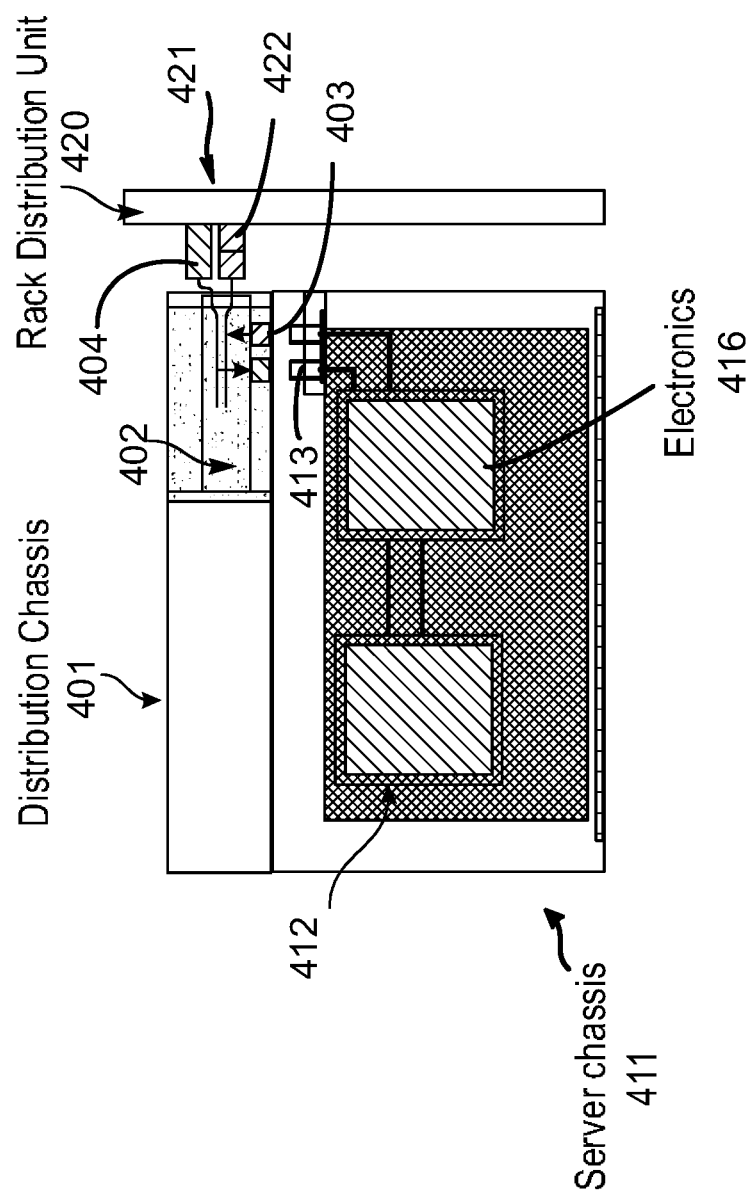
Figure 4C:
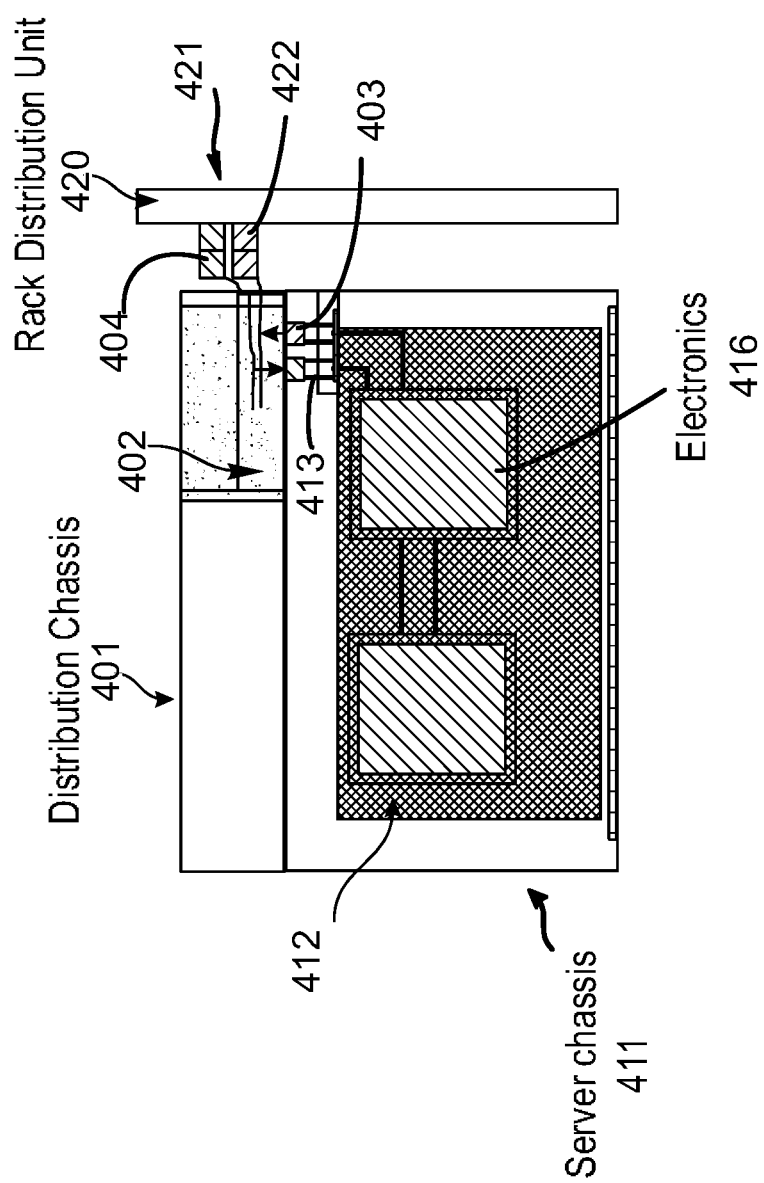

FIGS. 4A, 4B, 4C are diagrams 400a, 400b, 400c illustrating an example of operations to connect a distribution chassis 401 to a corresponding server node 412 according to some embodiments. An electronic rack 421 of a data center may comprise a rack distribution unit 420, a plurality of server chassis (e.g., 411) and a plurality of distribution chassis (e.g., 401). The server chassis 411 may include one or more server nodes, and each server node may represent a node (e.g., 412) associated with one or more electronics (e.g., 416). The distribution chassis 401 may correspond to the server chassis 411 and may be connected to the rack distribution unit 420. The distribution chassis 401 may be disposed above the corresponding server chassis 411 to distribute the cooling liquid to the one or more server nodes of the server chassis 411 representing the one or more nodes (e.g., 412). As illustrated in FIG. 4A, the electronics may be packaged on the board which is vertically mounted within the server node. In another embodiment, the main circuit board may be horizontally packaged within the chassis and the vertical board may be connected onto the main board. In still another embodiment, the electronics may be packaged on the board which is horizontally mounted within the server node.

The distribution chassis 401 may include a supporting frame, a node distribution unit 402 having one or more node connectors 403, and one or more main connectors 404. The node distribution unit 402 may be disposed to be movable such that the node connectors 403 may be connected with or disconnected from connectors 413 of the corresponding node 412.

Referring to FIG. 4A, at first, the distribution chassis 401 and the node 412 are both populated to the rack 421. Neither the connectors are connected. The node distribution unit 402 are movable along on one or more channels of the supporting frames of the distribution chassis 401. The node distribution unit 402 may be at an open position when the distribution chassis 401 and the node 412 are not connected.

Referring to FIG. 4B, the main connectors 404 may be connected with connectors 422 of the rack distribution unit 420. The main connectors 404 may receive the cooling liquid from the rack distribution unit 420 and return the warmer cooling liquid to the rack distribution unit 420. The main connectors 404 may be connected with connectors 422 of the rack distribution unit 420 through extension loops (e.g., 105). The distribution unit 401 may be connected to the main connectors 404 through flexible hoses.

Referring to FIG. 4C, the node distribution unit 402 within the distribution chassis 401 may be pushed down and the node connectors 403 on the node distribution unit 402 may be extended to the node 412, thus, the node connectors 403 may be connected with the connectors 413 of the node 412. The node distribution unit 402 may be pushed down to be moved along the one or more channels of the supporting frames to a connected position such that the node connectors 403 may be connected with the connectors 413 of the node 412. The node distribution unit 402 may also be pulled up to be moved along the one or more channels of the supporting frames to the open position such that the node connectors 403 may be disconnected with the connectors 413 of the node 412, for example, when the node 412 may need to be serviced.

Figure 5A:
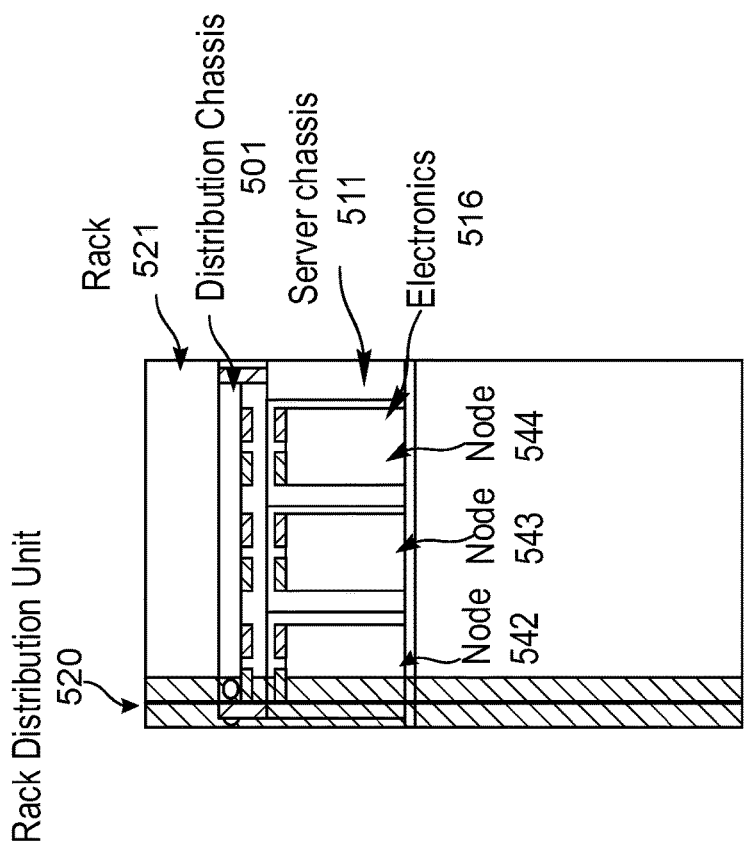
FIG. 5A is a diagram illustrating an example of a front view of an electronic rack according to some embodiments.
Figure 5B:
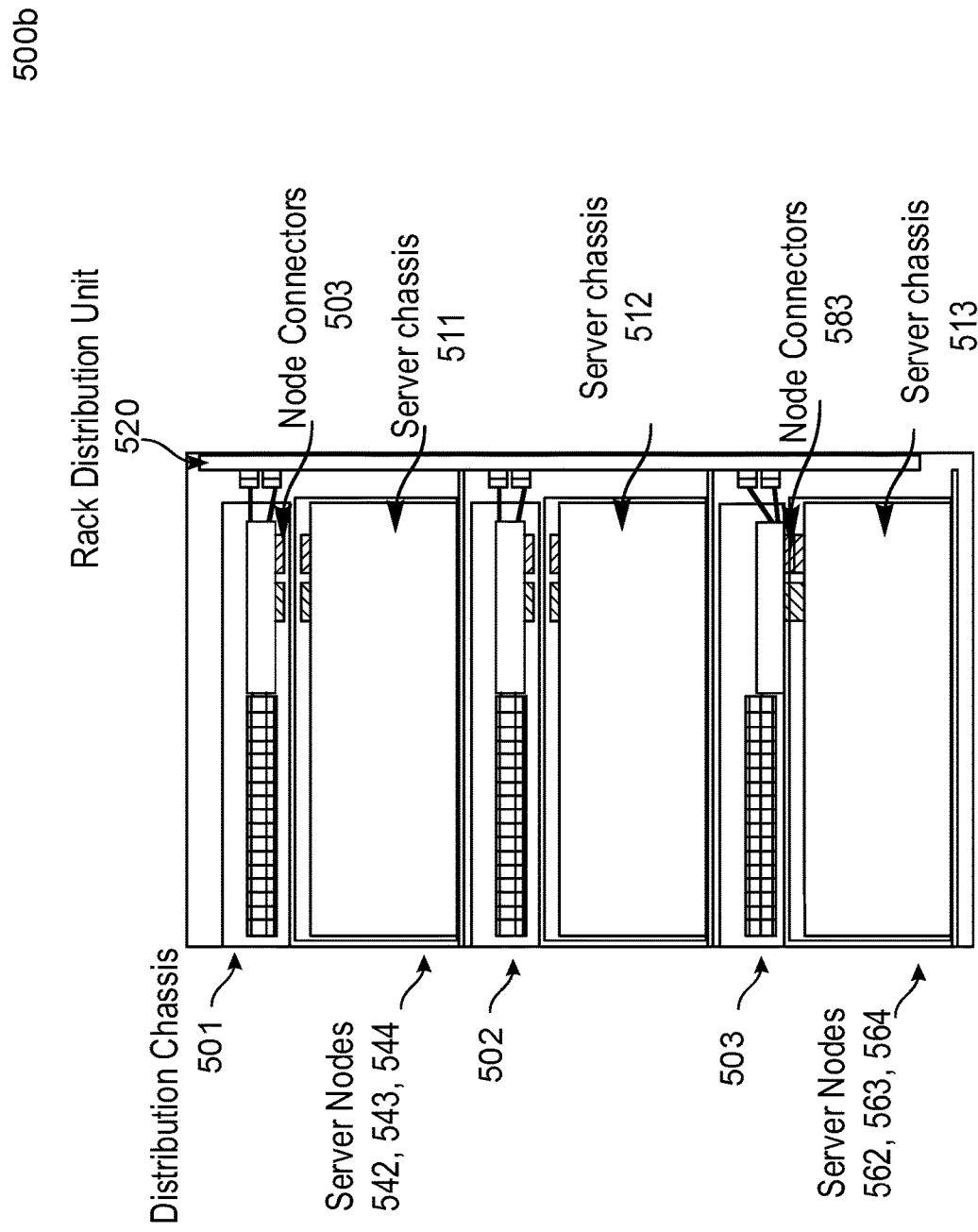
FIG. 5B is a diagram illustrating an example of a side view of an electronic rack according to some embodiments.

FIG. 5A is a diagram 500a illustrating an example of a front view of an electronic rack 521 according to some embodiments. FIG. 5B is a diagram illustrating an example of a side view of the electronic rack 521 according to some embodiments. Referring to FIGS. 5A and 5B, an electronic rack 521 of a data center may include a rack distribution unit 520, a plurality of server chassis (e.g., 511, 512, 513) and a plurality of distribution chassis (e.g., 501, 502, 503). The server chassis (e.g., 511) may include one or more server nodes, and each server node (e.g., 542, 543, 544) may represent a package associated with one or more electronics (e.g., 516). The distribution chassis (e.g., 501, 502, 503) may correspond to the server chassis (e.g., 511, 512, 513) and may be connected to the rack distribution unit 520. The distribution chassis (e.g., 501, 502, 503) may be disposed above the corresponding server chassis (e.g., 511, 512, 513) to distribute the cooling liquid to the one or more server nodes of the server chassis (e.g., 511, 512, 513) representing the one or more node (e.g., nodes 542-544).

As illustrated in FIG. 5A, several nodes 542, 543, 544 may be populated with the distribution chassis 501 disposed on the top of the server nodes 542, 543, 544. The node distribution unit of the distribution chassis 501 may be pushed down to connect to the server nodes 542, 543, 544 only after all the designed nodes are populated.

As illustrated in FIG. 5B, the electronic rack 521 of a data center may include the plurality of server chassis (e.g., 511, 512, 513) and the plurality of distribution chassis (e.g., 501, 502, 503). As an example, when the node distribution unit of the distribution chassis 503 is in the connected position after being pushed down, the node connectors 583 on the distribution chassis 503 are extended outside the distribution chassis 501 and connected to the connectors of the corresponding node (e.g., 562, 563, or 564). As another example, when the node distribution unit of the distribution chassis 501 is in the open position, the node connectors 503 on the distribution chassis 501 are disconnected from the connectors of the corresponding node (e.g., 542, 543, or 544) and are within the distribution chassis 501.

Figure 6:
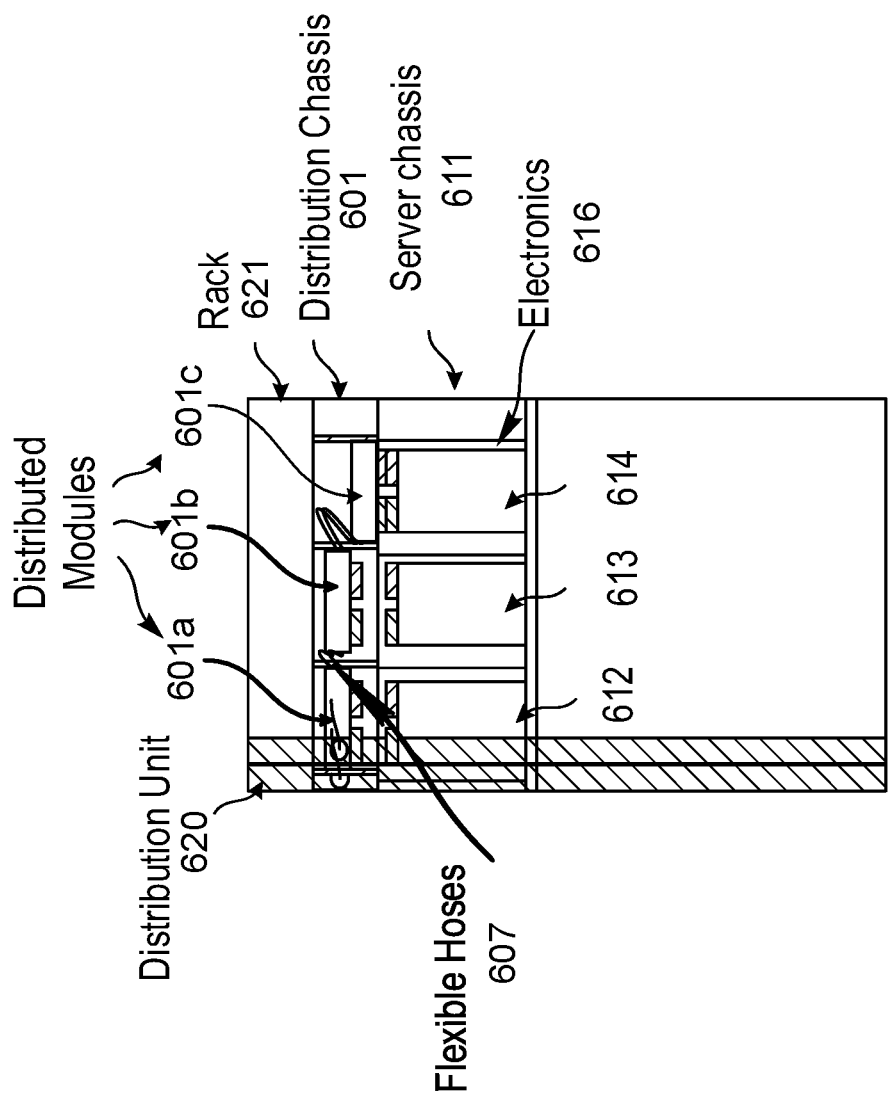
FIG. 6 is a diagram illustrating an example of an electronic rack with distributed modules according to some embodiments.

FIG. 6 is a diagram 600 illustrating an example of an electronic rack 621 with distributed modules (601a-601c) according to some embodiments. The distribution chassis 601 may be designed within individual distributed modules, e.g., 601a, 601b, 601c. The individual distribution modules, e.g., 601a, 601b, 601c, may be used in the distributed chassis. The distributed modules 601a, 601b, 601c may be connected through flexible hoses 607 and attached onto the supporting frames. Each distributed module, e.g., 601a, 601b, 601c, may include a respective node distribution unit having one or more respective node connectors. Each distributed module, e.g., 601a, 601b, 601c may distribute the cooling liquid or fluid to a corresponding individual IT node (e.g., 612, 613, 614) disposed under the distributed module. Each of the distributed modules 601a, 601b, 601c may be connected with a corresponding node. For example, the distributed module 601a may be connected with the node 612, the distributed module 601b may be connected with the node 613, and the distributed module 601c may be connected with the node 613. In this way, a more flexible operation on the IT nodes on the same row is enabled.

Figure 7:
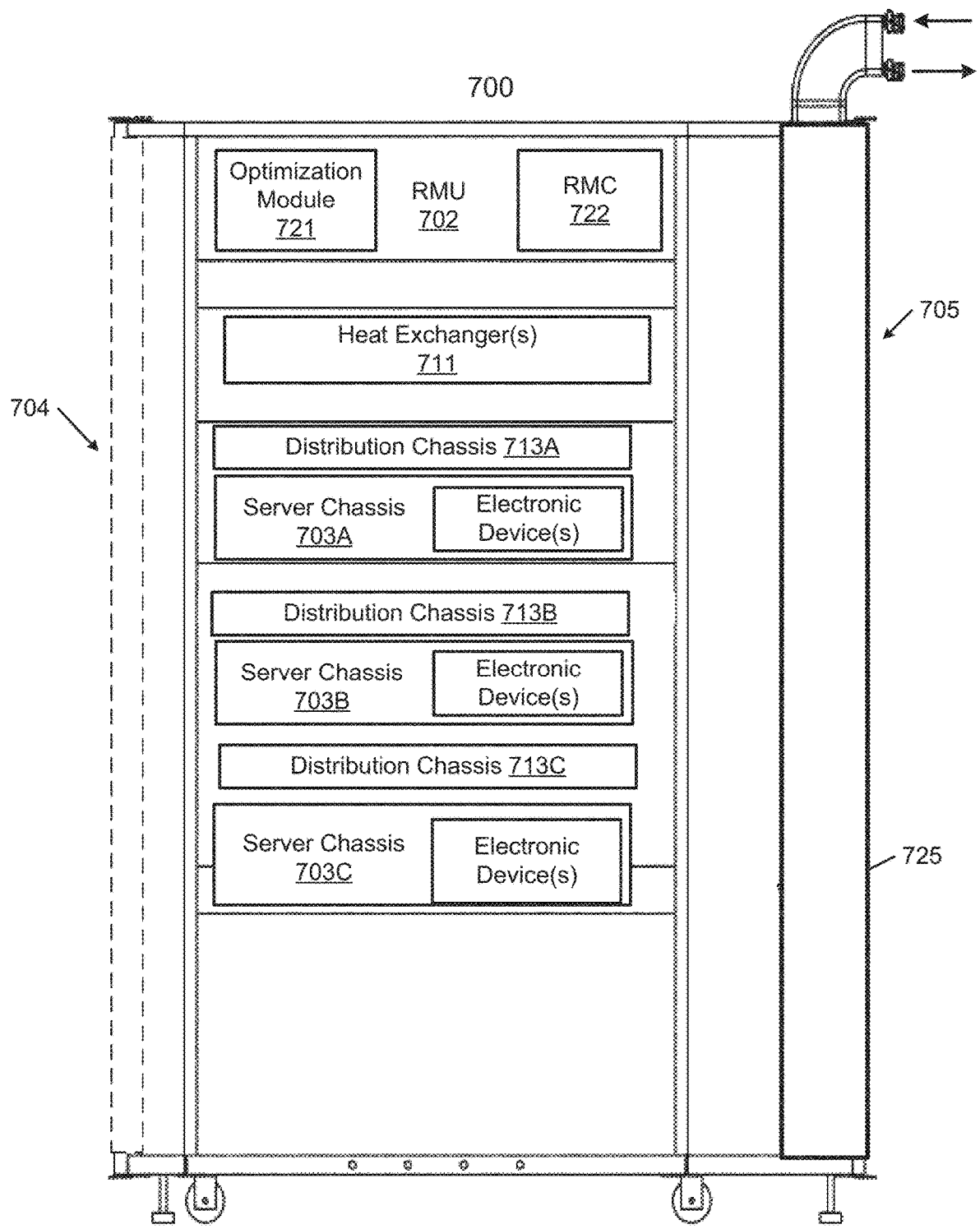
FIG. 7 is a block diagram illustrating an example of an electronic rack.

FIG. 7 is block diagram illustrating an electronic rack 700 according to one embodiment. Electronic rack 700 may represent any of the electronic racks as described throughout this application. According to one embodiment, electronic rack 700 includes, but is not limited to, a rack distribution unit 725, heat exchanger 711, rack management unit (RMU) 702, one or more distribution chassis 713A-713C (collectively referred to as distribution chassis 713) and one or more server chassis 703A-703C (collectively referred to as server chassis 703). The one or more distribution chassis 713 corresponding to the one or more server chassis 703 and connected to the rack distribution unit 725. Each of the distribution chassis (e.g., 713A, 713B, or 713C) is disposed above a corresponding server chassis (e.g., 703A, 703B, or 703C) to distribute cooling liquid to the server chassis.

Server chassis 703 can be inserted into an array of server slots (e.g., standard shelves) respectively from frontend 704 or backend 705 of electronic rack 700. Note that although there are three server chassis 703A-703C shown here, more or fewer server chassis may be maintained within electronic rack 700. Also note that the particular positions of heat exchanger 711, RMU 702, and/or server chassis 703 are shown for the purpose of illustration only; other arrangements or configurations of heat exchanger 711, RMU 702, and/or server chassis 703 may also be implemented. In one embodiment, electronic rack 700 can be either open to the environment or partially contained by a rack container, as long as the cooling fans can generate airflows from the frontend to the backend.

Each of server chassis 703 may include one or more information technology (IT) components (e.g., electronic devices such as processors, memory, and/or storage devices). In one embodiment, in at least some of the server chassis 703, an electronic device may be attached to a cold plate. The cold plate includes a liquid distribution channel to receive cooling liquid from the corresponding distribution chassis. The cooling liquid performs heat exchange from the heat generated from the electronic device attached thereon. The cooling liquid carrying the exchanged heat is returned to the corresponding distribution chassis and back to the rack distribution unit 725.

Some of the IT components or electronics may perform data processing tasks, where the IT components may include software installed in a machine-readable medium such as a storage device, loaded into a memory, and executed by one or more processors to perform the data processing tasks. Server chassis 703 may include a host server (referred to as a host node) coupled to one or more compute servers (also referred to as computing nodes). The host server (having one or more central processing units or CPUs) typically interfaces with clients over a network (e.g., Internet) to receive a request for a particular service such as storage services (e.g., cloud-based storage services such as backup and/or restoration), executing an application to perform certain operations (e.g., image processing, deep data learning algorithms or modeling, etc., as a part of a software-as-a-service or SaaS platform). In response to the request, the host server distributes the tasks to one or more of the computing nodes or compute servers (having one or more graphics/general processing units or GPUs) managed by the host server. The compute servers perform the actual tasks, which may generate heat during the operations.

Electronic rack 700 further includes optional RMU 702 configured to provide and manage power supplied to servers 703 and heat exchanger 711. RMU 702 may be coupled to a power supply unit (not shown) to manage the power consumption of the power supply unit. The power supply unit may include the necessary circuitry (e.g., an alternating current (AC) to direct current (DC) or DC to DC power converter, battery, transformer, or regulator, etc.) to provide power to at least some of the remaining components of electronic rack 700.

In one embodiment, RMU 702 includes optional optimization module 721 and rack management controller (RMC) 722. RMC 722 may include a monitor to monitor operating status of various components within electronic rack 700, such as, for example, computing nodes, and heat exchanger 711. Specifically, the monitor receives operating data from various sensors representing the operating environments of electronic rack 700. For example, the monitor may receive operating data representing temperatures of the processors, cooling liquid, and airflows, which may be captured and collected via various temperature sensors. These operating data are referred to as real-time operating data. Note that the monitor may be implemented as a separate module within RMU 702.

In the foregoing specification, embodiments of the invention have been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. An electronic rack of a data center, comprising:
a rack distribution unit;
a plurality of server chassis, each of the plurality of server chassis including one or more server nodes, each server node representing a package associated with one or more electronics; and
a plurality of distribution chassis corresponding to the plurality of server chassis and connected to the rack distribution unit, wherein each of the distribution chassis is disposed above a corresponding server chassis to distribute cooling liquid to the one or more server nodes of the server chassis, wherein each of the plurality of distribution chassis includes
a supporting frame,
a node distribution unit having one or more node connectors, and
one or more main connectors, wherein the node distribution unit is connected to the rack distribution unit by the one or more main connectors, wherein the node distribution unit is disposed to be movable along the supporting frame from a first position to a second position, and wherein the one or more node connectors of the node distribution unit are connected with one or more fluid connecters of a corresponding server node when the node distribution unit is in the second position.

2. The electronic rack of claim 1, wherein, for each of the plurality of distribution chassis, the node distribution unit is connected with the one or more main connectors through extension loops.

3. The electronic rack of claim 1, wherein, for each of the plurality of distribution chassis, the one or more node connectors include one or more blind mating node connectors configured to be connected with the one or more fluid connecters of a corresponding server node.

4. The electronic rack of claim 1, wherein each of the plurality of distribution chassis includes one or more distributed modules, wherein the one or more distributed modules are connected through flexible hoses.

5. The electronic rack of claim 1, wherein, for each of the plurality of server chassis, the server node includes one or more fluid connecters disposed at a top of a corresponding server chassis.

6. The electronic rack of claim 1, wherein, for each of the plurality of server chassis, the server node includes a connector assembler which one or more fluid connecters are fixed onto.

7. The electronic rack of claim 1, wherein, for each of the plurality of server chassis, the server note includes a leak detection cable connected to a connector assembler and a leak detection cable disposed at a bottom of a corresponding server chassis.

8. A data center system, comprising:
an array of electronic racks, each electronic racks containing a plurality of server chassis and each server chassis corresponding to one or more servers, wherein each electronic rack comprises:
a rack distribution unit;
the plurality of server chassis, each of the plurality of server chassis including one or more server nodes, each server node representing a package associated with one or more electronics; and
a plurality of distribution chassis corresponding to the plurality of server chassis and connected to the rack distribution unit through fluid connectors, wherein each of the distribution chassis is disposed above a corresponding server chassis to distribute cooling liquid to the one or more server nodes of the server chassis, wherein each of the plurality of distribution chassis includes
a supporting frame,
a node distribution unit having one or more node connectors, and
one or more main connectors, wherein the node distribution unit is connected to the rack distribution unit by the one or more main connectors, wherein the node distribution unit is disposed to be movable along the supporting frame from a first position to a second position, and wherein the one or more node connectors of the node distribution unit are connected with one or more fluid connecters of a corresponding server node when the node distribution unit is in the second position.

9. The data center system of claim 8, wherein, for each of the plurality of distribution chassis, the node distribution unit is connected with the one or more main connectors through extension loops.

10. The data center system of claim 8, wherein, for each of the plurality of distribution chassis, the one or more node connectors include one or more blind mating node connectors configured to be connected with the one or more fluid connecters of a corresponding server node.

11. The data center system of claim 8, wherein each of the plurality of distribution chassis includes one or more distributed modules, wherein the one or more distributed modules are connected through flexible hoses.

12. The data center system of claim 8, wherein, for each of the plurality of server chassis, the server node includes one or more fluid connecters disposed at a top of a corresponding server chassis.

13. The data center system of claim 8, wherein, for each of the plurality of server chassis, the server node includes a connector assembler which one or more fluid connecters are fixed onto.

14. The data center system of claim 9, wherein, for each of the plurality of server chassis, the server note includes a leak detection cable connected to a connector assembler and a leak detection cable disposed at a bottom of a corresponding server chassis.

15. A distribution chassis comprising:
a supporting frame;
one or more main connectors; and
a node distribution unit having one or more node connectors, wherein the distribution chassis corresponding to a server chassis and connected to a rack distribution unit, wherein the server chassis includes one or more server nodes, each server node representing a package associated with one or more electronics, wherein the distribution chassis is disposed above the server chassis to distribute cooling liquid to the one or more server nodes of the server chassis, wherein the node distribution unit is disposed to be movable along the supporting frame from a first position to a second position, and wherein the one or more node connectors of the node distribution unit are connected with one or more fluid connecters of a corresponding server node when the node distribution unit is in the second position.

16. The distribution chassis of claim 15, wherein the node distribution unit is connected with the one or more main connectors through extension loops.

17. The distribution chassis of claim 15, wherein the one or more node connectors include one or more blind mating node connectors configured to be connected with the one or more fluid connecters of a corresponding server node.

18. The distribution chassis of claim 15, wherein the one or more main connectors are connected to the node distribution unit through flexible hoses.

19. The distribution chassis of claim 15, wherein the distribution chassis includes one or more distributed modules, and wherein the one or more distributed modules are connected through flexible hoses.

20. The distribution chassis of claim 15, wherein the nodedistribution unit is connected to the rack distribution unit by the one or more main connectors.

* * * * *